United States Patent
Hsia et al.

(10) Patent No.: US 8,912,033 B2
(45) Date of Patent: Dec. 16, 2014

(54) DICING-FREE LED FABRICATION

(75) Inventors: Hsing-Kuo Hsia, Jhubei (TW); Chih-Kuang Yu, Chiayi (TW); Gordon Kuo, Taipei (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 233 days.

(21) Appl. No.: 12/900,663

(22) Filed: Oct. 8, 2010

(65) Prior Publication Data
US 2012/0088322 A1    Apr. 12, 2012

(51) Int. Cl.
*H01L 21/00*    (2006.01)
*H01L 33/00*    (2010.01)

(52) U.S. Cl.
CPC ..... *H01L 33/0079* (2013.01); *H01L 2933/0016* (2013.01); *H01L 33/0095* (2013.01)
USPC .................. 438/68; 438/33; 438/463; 257/99; 257/594; 257/618; 257/E21.025; 257/E21.028; 257/E33.064; 257/E33.072

(58) Field of Classification Search
USPC .......... 438/33, 68, 463; 257/98, 99, 594, 618, 257/E21.025, E21.028, E33.064, E33.072
See application file for complete search history.

(56) References Cited

U.S. PATENT DOCUMENTS

| | | | |
|---|---|---|---|
| 2006/0105542 A1* | 5/2006 | Yoo | 438/455 |
| 2006/0154390 A1* | 7/2006 | Tran et al. | 438/22 |
| 2008/0113462 A1* | 5/2008 | Kim et al. | 438/33 |
| 2008/0211416 A1* | 9/2008 | Negley et al. | 315/193 |
| 2009/0029499 A1* | 1/2009 | Nakahara | 438/46 |
| 2010/0186883 A1* | 7/2010 | Tomoda | 156/220 |

* cited by examiner

*Primary Examiner* — Su Kim
(74) *Attorney, Agent, or Firm* — Haynes and Boone, LLP (57) ABSTRACT

Provided is a method of fabricating a light-emitting diode (LED) device. The method includes providing a substrate having opposite first and second sides. A semiconductor layer is formed on the first side of the substrate. The method includes forming a photoresist layer over the semiconductor layer. The method includes patterning the photoresist layer into a plurality of photoresist components. The photoresist components are separated by openings. The method includes filling the openings with a plurality of thermally conductive components. The method includes separating the semiconductor layer into a plurality of dies using a radiation process that is performed to the substrate from the second side. Each of the first regions of the substrate is aligned with one of the conductive components.

20 Claims, 9 Drawing Sheets

DICING-FREE LED FABRICATION

BACKGROUND

The semiconductor integrated circuit (IC) industry has experienced rapid growth in recent years. Technological advances in IC materials and design have produced various types of ICs that serve different purposes. One type of these ICs includes photonic devices, such as light-emitting diode (LED) devices. The LED devices are typically fabricated on a wafer. To package the individual LED devices, the LED wafer is traditionally sliced to separate the sliced pieces of the wafer into LED dies. However, the slicing process involves the use of mechanical tools, which may be costly. Further, the slicing process may create contaminant particles on the LED devices, which will limit the yield and performance of the LED devices. In addition, the mechanically-sliced LED dies may have unsmooth edges, which may also adversely impact the LED device's performance.

Therefore, while existing methods of fabricating the LED devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
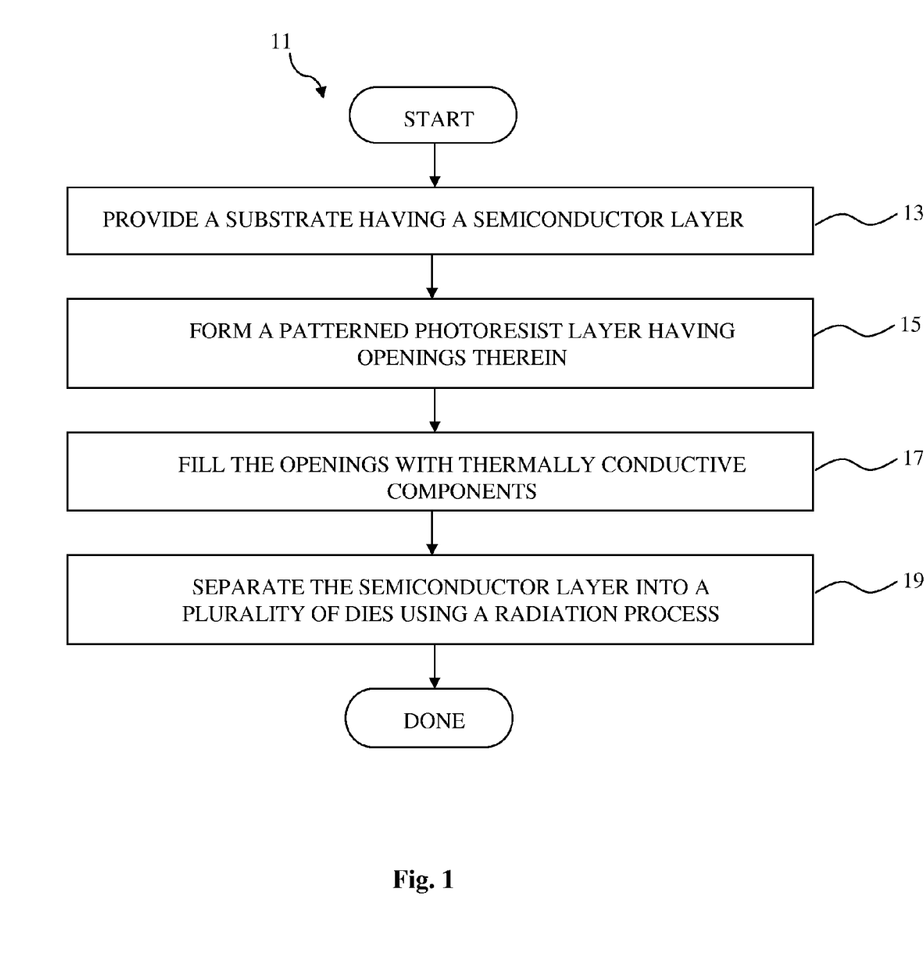
FIG. 1 is a flowchart illustrating a method for fabricating a LED device according to various aspects of the present disclosure.

Illustrated in FIG. 1 is a flowchart of a method 11 for fabricating an LED device according to various aspects of the present disclosure. Referring to FIG. 1, the method 11 begins with block 13 in a substrate having a semiconductor layer is provided. The substrate may be a sapphire substrate. The substrate has opposite first and second sides. The semiconductor layer is formed on the first side of the substrate. The semiconductor layer may include oppositely doped gallium nitride epi-layers. The method 11 continues with block 15 in which a patterned photoresist layer is formed over the semiconductor layer. The patterned photoresist layers have a plurality of openings therein. The method 11 continues with block 17 in which each of the openings is filled with a conductive component. The conductive component may be thermally and electrically conductive and may include a metal. The method 11 continues with block 19 in which the semiconductor layer is separated into a plurality of LED dies using a localized radiation process. The radiation process is performed from the second side of the substrate. The radiation process includes radiating a plurality of first regions of the substrate. Each of the first regions of the substrate is aligned with one of the conductive components.

FIGS. 2 to 9 are diagrammatic fragmentary cross-sectional side views of a portion of an LED wafer (a wafer containing LED devices) at various fabrication stages according to embodiments of the method 11 of FIG. 1. The word "wafer" is used herein to refer to the substrate of the wafer as well as the various components formed on the wafer. It is understood that FIGS. 2 to 9 have been simplified for a better understanding of the inventive concepts of the present disclosure.

Figure 2:
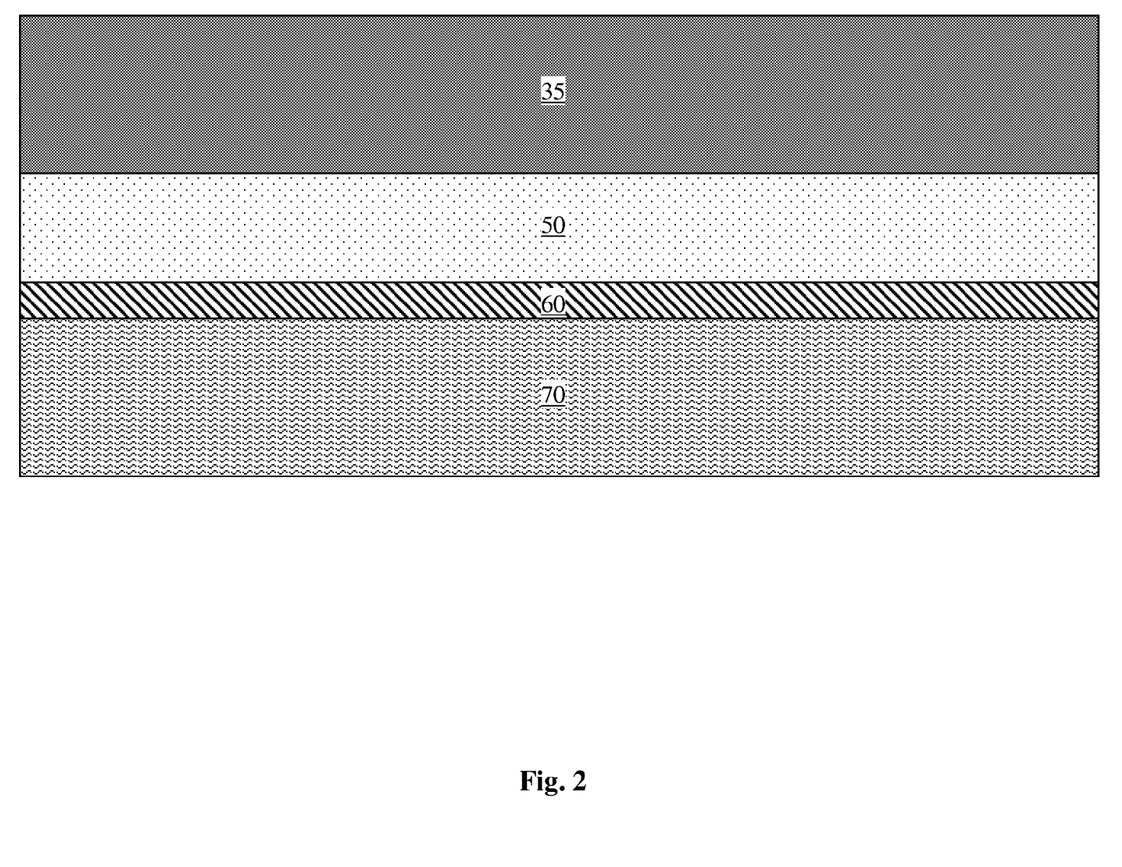
FIGS. 2-9 are diagrammatic fragmentary cross-sectional side views of a portion of a wafer containing LED devices at various stages of fabrication in accordance with various aspects of the present disclosure.

Referring to FIG. 2, a substrate 35 is provided. The substrate 35 includes a material that is suitable for growing a light-emitting material. Thus, the substrate 35 may also be referred to as a growth substrate or a growth wafer. In one embodiment, the substrate 35 includes a sapphire material. In other embodiments, the substrate 35 may include silicon carbide, silicon, or another suitable material for growing the light-emitting material.

A semiconductor layer 50 is formed on the substrate 35. The semiconductor layer 50 includes oppositely doped semiconductor layers, which may form a P/N junction. In an embodiment, the semiconductor layer 50 includes a layer of gallium nitride (GaN) material doped with a p-type dopant such as boron (B), and a layer of gallium nitride material doped with an n-type dopant such as arsenic (As) or phosphorous (P).

The semiconductor layer 50 may also include a multiple quantum well (MQW) layer that is disposed in between the oppositely doped (p-type and n-type) layers. The MQW layer has alternating (or periodic) layers of gallium nitride and indium gallium nitride (InGaN). For example, in one embodiment, the MQW layer may have ten (or any other suitable number) layers of gallium nitride and ten (or any other suitable number) layers of indium gallium nitride, where an indium gallium nitride layer is formed on a gallium nitride layer, and another gallium nitride layer is formed on the indium gallium nitride layer, so on and so forth. For the sake of simplicity, the oppositely doped p-type and n-type layers and the MQW layer within the semiconductor layer 50 are not specifically illustrated.

The oppositely doped layers and the MQW layer of the semiconductor layer 50 are formed by an epitaxial growth process known in the art. In the epitaxial growth process, the substrate 35 acts as a seed crystal, and the layers of the semiconductor layer 50 take on a lattice structure and an orientation that are substantially identical to those of the substrate 35. After the completion of the epitaxial growth process, a P/N junction (or a P/N diode) is formed by the disposition of the MQW layer between the oppositely doped p-type and n-type layers.

When an electrical voltage (or electrical charge) is applied to the doped layers, electrical current flows through the MQW layer. As a result, the MQW layer emits radiation such as light in an observable spectrum. The color of the light emitted by the MQW layer corresponds to the wavelength of the light. The wavelength of the light (and hence the color of the light) may be tuned by varying the composition and structure of the materials that make up the MQW layer.

A layer 60 is then formed on the semiconductor layer 50. The layer 60 includes a conductive material. In an embodiment, the layer 60 includes a metal material, for example, Aluminum, Silver, combinations thereof, or another suitable metal material. The layer 60 may be formed by chemical vapor deposition (CVD), physical vapor deposition (PVD), e-gun, thermal evaporator, or another suitable technique.

In an embodiment, the layer 60 serves as an Ohmic contact, meaning its current-voltage (I/V) curve is substantially linear and symmetric. In another embodiment, the layer 60 serves as a reflective layer, or a mirror, to reflect light emitted by light-emitting diode (LED) devices that will be formed from the semiconductor layer 50. In yet another embodiment, the layer 60 serves as a capped layer to protect the semiconductor layer 50. In one more embodiment, the layer 60 serves as a seed layer (also referred to as an adhesive layer) for a plating process to be performed later, which will be discussed below. It is understood that the layer 60 may serve all the functions/purposes discussed above. Alternatively, a separate layer may be formed to carry out each of these functions/purposes discussed above. For example, the layer 60 may serve as the Ohmic contact layer, another layer may be formed over the layer 60 and may serve as the reflective layer, and a capped layer may be formed over the reflective layer, etc.

A photoresist layer 70 is then formed over the layer 60. The photoresist layer 70 includes a photosensitive material and may be formed by a spin-coating process or another suitable technique.

Figure 3:
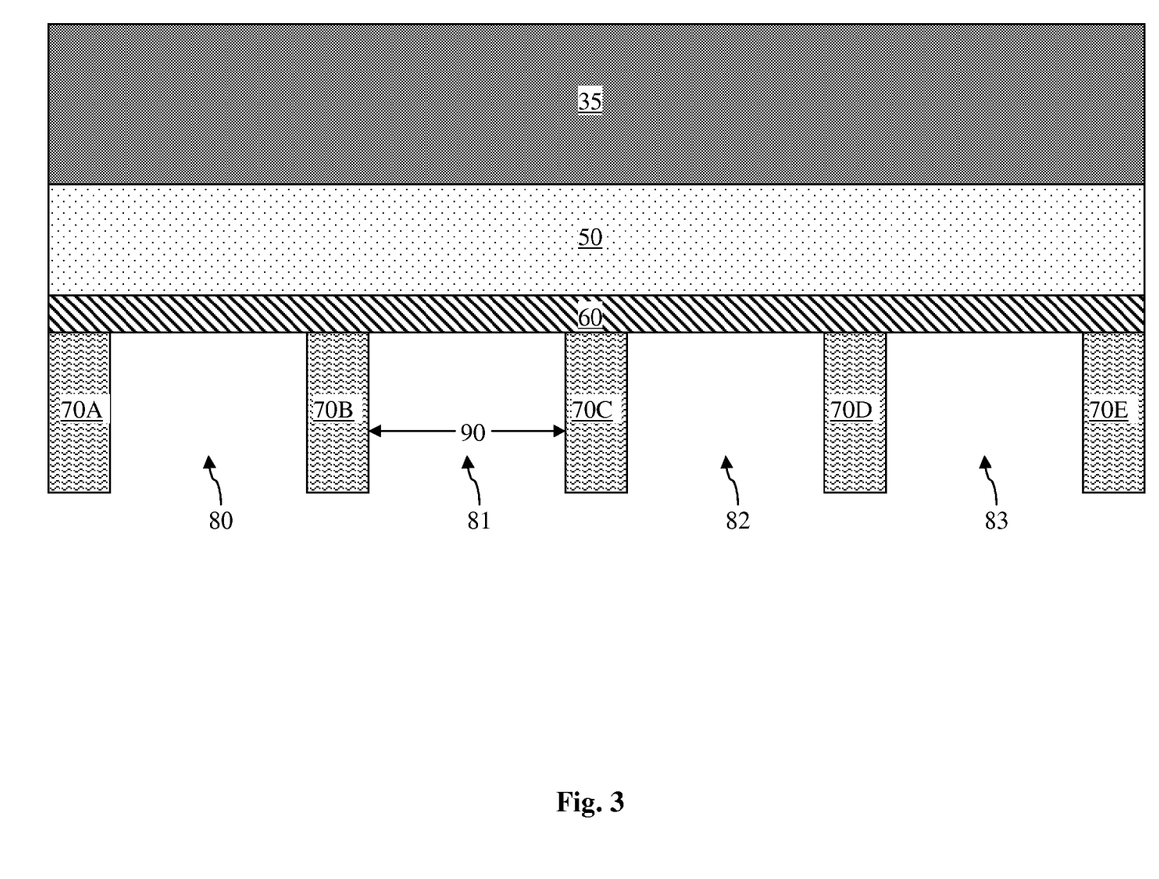

Referring now to FIG. 3, the photoresist layer 70 is patterned by a photolithography process, also referred to as a patterning process. The photolithography process may include a plurality of masking, exposing, developing, baking, rinsing, and stripping processes, among other processes. As a result of the photolithography process, the photoresist layer is patterned into a plurality of photoresist components (also referred to as photoresist portions). For the sake of providing an example, five of such photoresist components 70A, 70B, 70C, 70D, and 70E are shown in FIG. 3. The photoresist components 70A-70E are each formed to be in (or over) a scribe line (also referred to as a street line) region of the wafer. The scribe line or street line regions are where the LED dies are to be physically separated before they are packaged. One reason for forming the photoresist components 70A-70E is to avoid cutting of metal in the fabrication of LED devices. This will be discussed in more detail below.

The photoresist components 70A-70E are separated by openings 80, 81, 82, and 83. The openings 80-83 each have a lateral dimension (or width) 90. In an embodiment, the width 90 is in a range from about 0.5 mili-meter (mm) to about 2 mm. It is understood that in alternative embodiments, the openings 80-83 may not have equal lateral dimensions.

Figure 4:
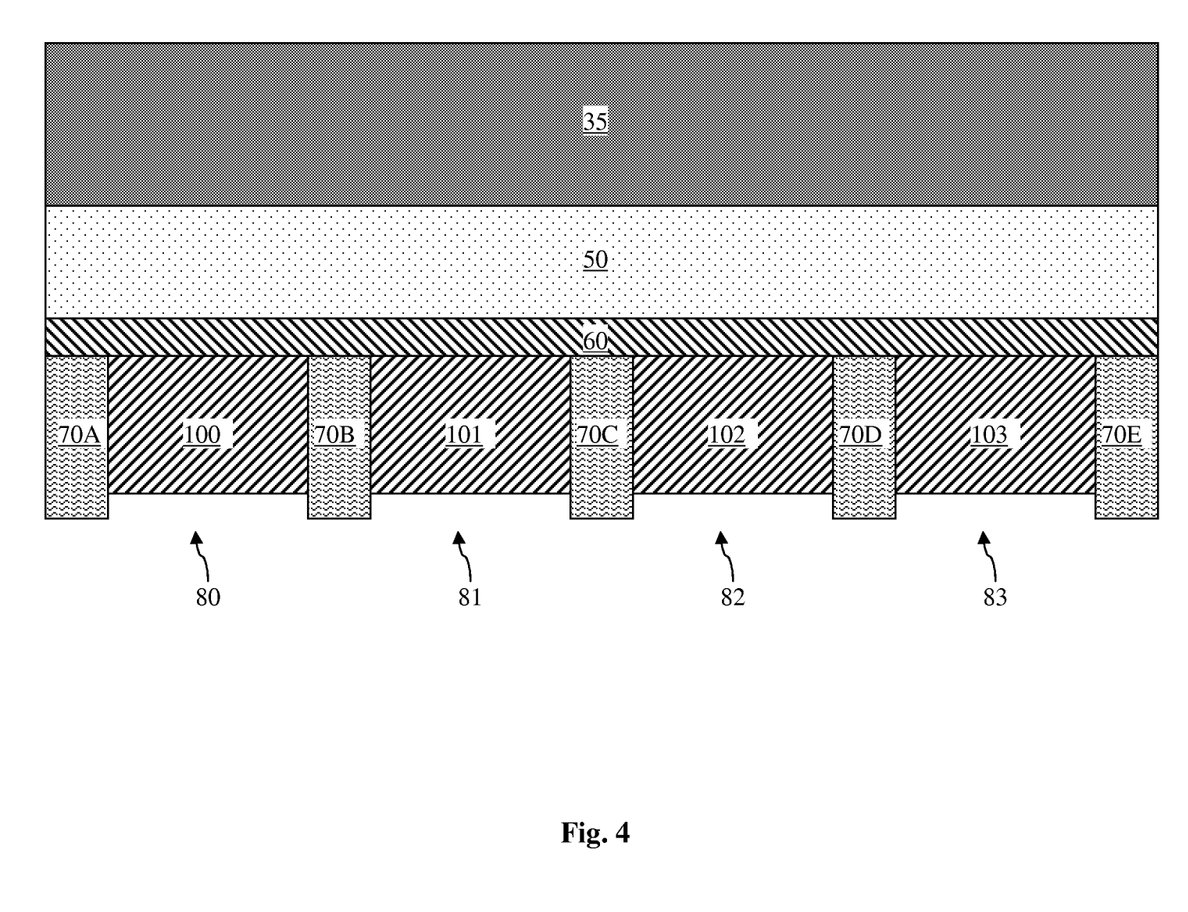

Referring now to FIG. 4, conductive components (also referred to as conductive portions) 100, 101, 102, and 103 are formed in the openings 80, 81, 82, and 83, respectively. In an embodiment, the conductive components 100-103 are formed using an electrochemical plating (ECP) process known in the art. As discussed above, the layer 60 may serve as a seed layer in the ECP process for growing the conductive components 100-103 in the openings 80-83. Alternatively, another layer may be formed over the layer 60 to serve as the seed layer for the ECP process. In an embodiment, the conductive components 100-103 each include a material that is both thermally conductive and electrically conductive, such as a metal material. The conductive components 100-103 at least partially fill the openings 80-83.

Figure 5:
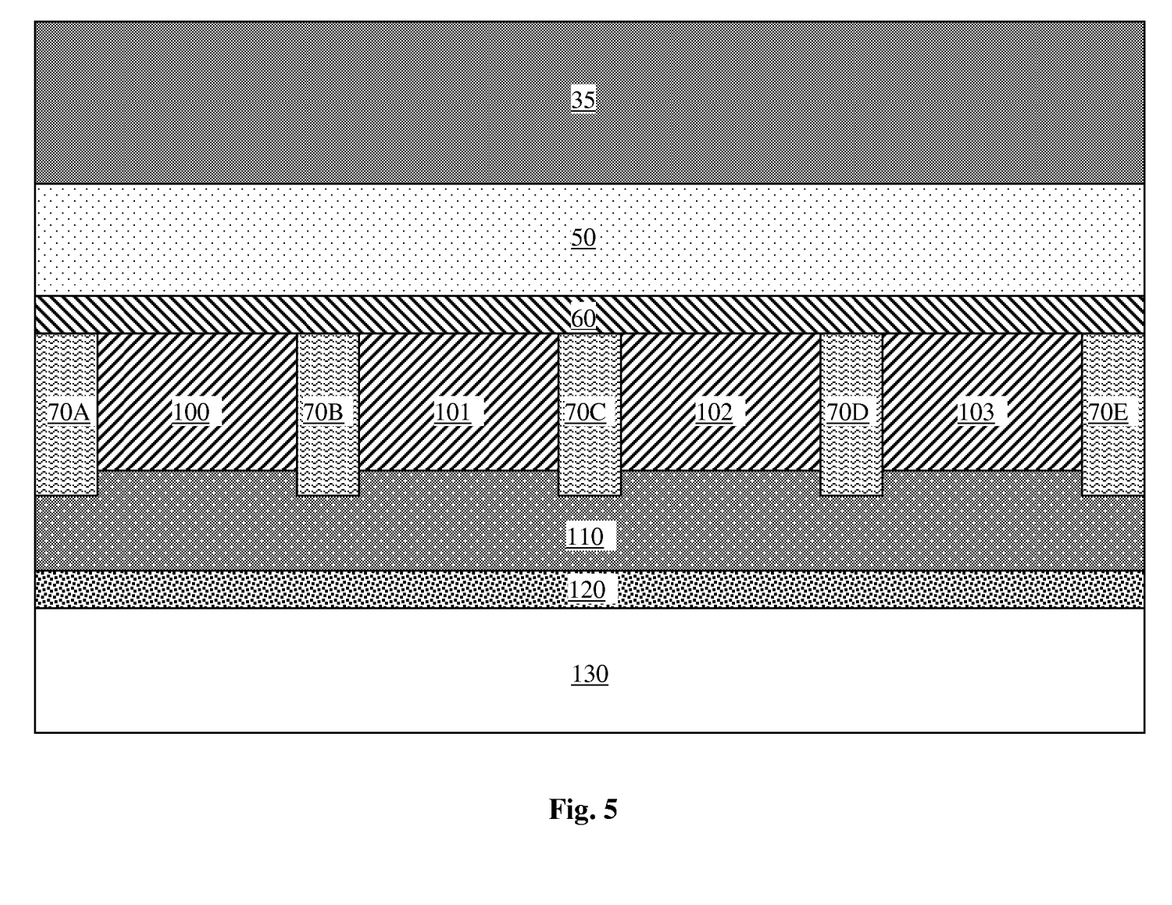

Referring to FIG. 5, a glue material (also referred to as an adhesive material) 110 is formed over the photoresist components 70A-70E and the conductive components 100-103. In an embodiment, the glue material 110 is a material that is activated by an ultra-violet (UV) light, that is, the glue material 110 becomes irreversibly adhesive after being radiated by a suitable UV light.

Thereafter, a layer 120 is formed over the glue material 110. In an embodiment, the layer 120 includes a light-to-heat conversion material. As such, the layer 120 may also be referred to as a light-to-heat conversion (LTHC) conversion layer. This means that the layer 120 is operable to absorb radiation waves such as light, and then convert that radiation to heat.

A substrate 130 is then bonded to the layer 120 using a glass bonding technique known in the art. In an embodiment, the substrate 130 includes a glass substrate. The glass material of the substrate 130 is chosen so that it will let a substantial amount of radiation pass through without absorbing the radiation. In an alternative embodiment, the light-to-heat conversion layer 120 is formed on the glass substrate 130 first, and then the glass substrate 130 is bonded to the glue material 110 with the light-to-heat conversion layer being the interface between the glue material 110 and the glass substrate 130.

Figure 6:
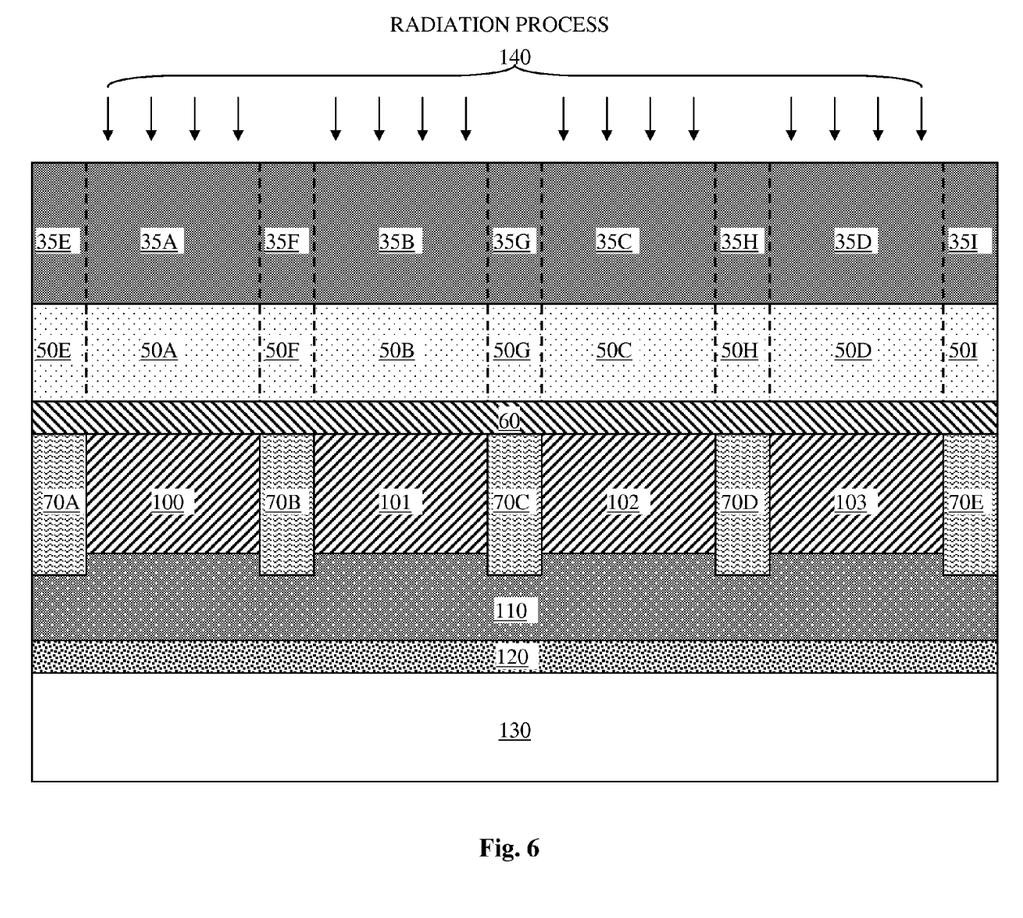

Referring now to FIG. 6, a localized radiation process 140 is performed on the substrate 35. The radiation process 140 is performed from a side of the substrate 35 opposite to the side of the substrate 35 on which the semiconductor layer 50 is formed. In an embodiment, the radiation process 140 includes a laser scan process that uses a 248 nanometer (nm) KrF laser. The radiation process 140 is localized in the sense that only selected regions of the substrate 35 are exposed to the radiation. Correspondingly, only the regions of the semiconductor layer 50 that are aligned with the selected regions of the substrate 35 are exposed to the radiation.

In an embodiment, the regions of the substrate 35 and the corresponding regions of the semiconductor layer 50 being radiated are each substantially aligned with one of the conductive components 100-103. For the sake of clarity, these regions are designated as regions 35A-35D and 50A-50D, respectively, wherein the boundaries of these regions are shown as dashed lines within the substrate 35 and the semiconductor layer 50. The remaining regions of the substrate 35 and the semiconductor layer 50 are each aligned with one of the photoresist components 70A-70E. These remaining regions of the substrate 35 and the semiconductor layer 50 are designated as regions 35E-35I and 50E-50I, respectively, for the sake of clarity.

It is understood that in alternative embodiments, the regions 35A-35D and 50A-50D may be narrower than the conductive components 100-103. Alternatively stated, the regions 35A-35D and 50A-50D may have smaller lateral dimensions than the lateral dimension 90 of the openings 80-83 (shown in FIG. 3), which is also the lateral dimension of the conductive components 50A-50D (since the conductive components 50A-50D fill the openings 80-83).

The radiation from the radiation process 140 is selected in a manner so that it mostly passes through the substrate regions 35A-35D and get absorbed by semiconductor regions 50A-50D. As a result of the radiation, a nitrogen gas is generated and released at the interfaces between the substrate and semiconductor regions 35A and 50A, 35B and 50B, 35C and 50C, 35D and 50D, respectively. Consequently, the substrate regions 35A-35D become separated from the semiconductor regions 50A-50D. Meanwhile, the substrate regions 35E-35I are still attached to the semiconductor regions 50E-50I, because these regions were not exposed to radiation, and thus no nitrogen gas was released between their respective interfaces.

In an alternative embodiment, a dry etching process is performed to etch away the substrate regions 35E-35I and the semiconductor regions 50E-50I before the radiation process 140 is performed. Thus, openings will be formed in place of the substrate regions 35E-35I and the semiconductor regions 50E-50I. This dry etching process may be carried out in a manner so that the openings have substantially smooth sidewalls. For the sake of simplicity, this alternative embodiment is not specifically illustrated.

Figure 7:
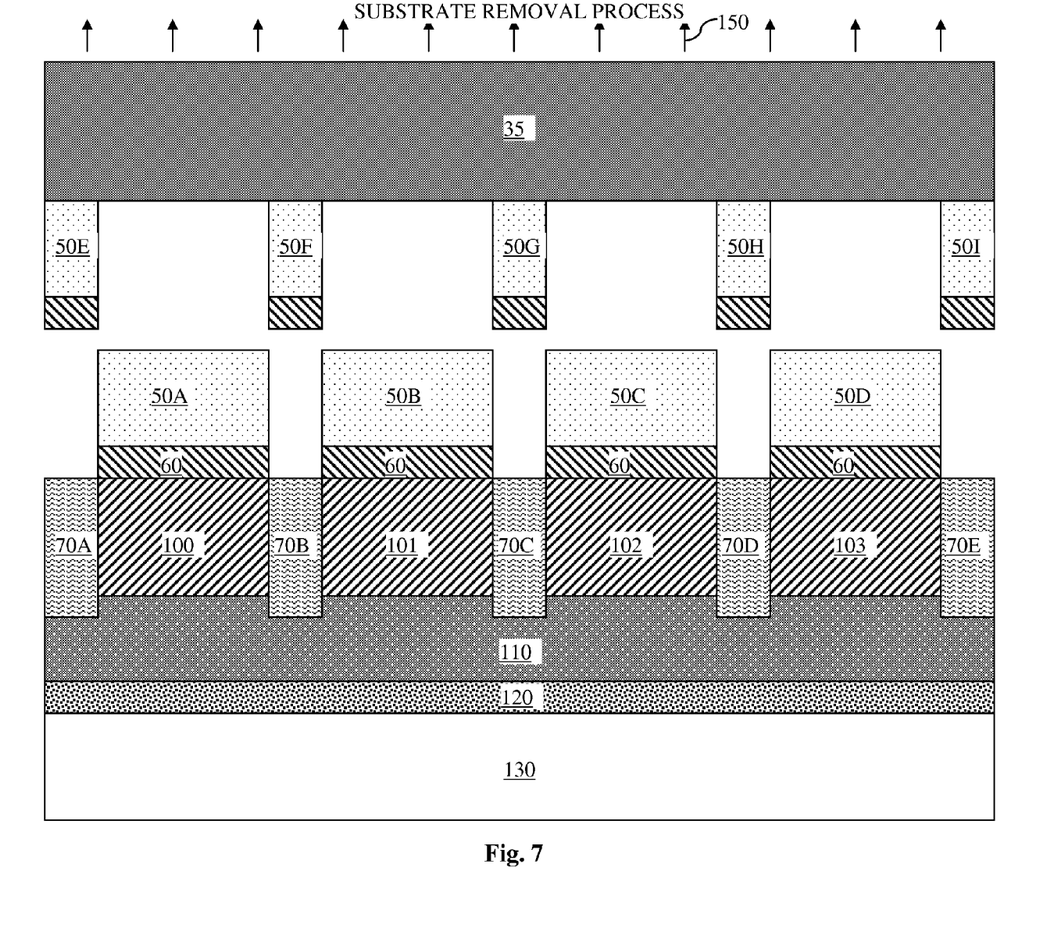

Referring now to FIG. 7, the substrate 35 is removed along with the semiconductor regions 50E-50I using a substrate removal process 150. The substrate removal process 150 may include a lift off process. The substrate 35 can be easily lifted off the semiconductor regions 50A-50D, since the radiation process 140 (shown in FIG. 6) has already separated the substrate 35 from the regions 50A-50D through the release of nitrogen gas. The semiconductor regions 50E-50I can be removed along with the substrate 35 because the semiconductor regions 50E-50I still remain attached to the substrate 35 at the completion of the radiation process 140, as discussed above. The substrate 130 provides mechanical strength and support during the substrate removal process 150.

In an embodiment, portions of the layer 60 below (and aligned with) the semiconductor regions 50E-50I also remain attached during the substrate removal process 150 and are therefore removed together with the substrate 35. In an alternative embodiment, these portions of the layer 60 below and aligned with the semiconductor regions 50E-50I may be etched away after the substrate removal process 150 is performed. In addition, it is understood that in some alternative embodiments, the substrate 35 may be removed using a grinding process, a chemical-mechanical polishing (CMP) process, or one or more suitable etching processes.

Figure 8:
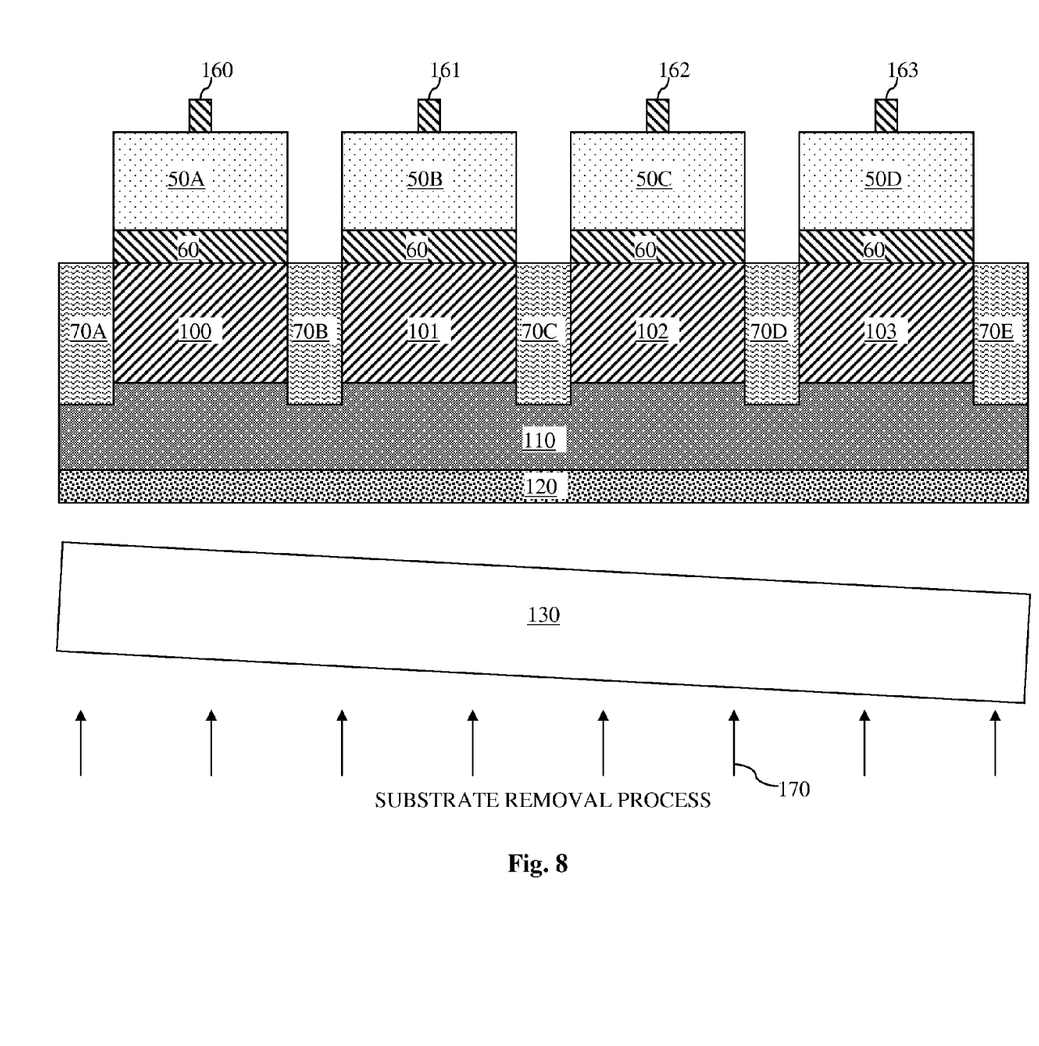

Referring to FIG. 8, contact pads (also referred to as electrodes) 160, 161, 162, and 163 may be formed on the semiconductor regions 50A, 50B, 50C, and 50D, respectively. The semiconductor regions 50A-50D are main portions of LED dies and may be referred to as LED dies or LED devices. The contact pads 160-163 may be used to apply electrical voltages to the LED dies 50A-50D.

After the contact pads 160-163 are formed, a substrate removal process 170 is then performed to removal the substrate 130. In an embodiment, the substrate removal process 170 includes a laser scan process, in which the substrate 130 is radiated by a laser. As discussed above, the material of the substrate 130 is selected so that it absorbs a minimal amount of radiation. Therefore, the radiation from the laser scan process mostly passes through the substrate 130 without being absorbed, and most of the radiation is actually absorbed by the layer 120.

Also as discussed before, the layer 120 includes a material that converts radiation such as light into heat. Thus, the radiation from the laser scan process is absorbed by the layer 120 and subsequently transformed into heat energy. The heat energy causes the substrate 130 to become de-coupled from the layer 120. Thus, the substrate 130 may be de-bonded from the layers above using the laser scan process. In alternative embodiments, the substrate 130 may be de-bonded using a chemical treatment process, a peeling off process, or combinations thereof. The layer 120 may be removed during the removal of the substrate 130 or thereafter.

Figure 9:
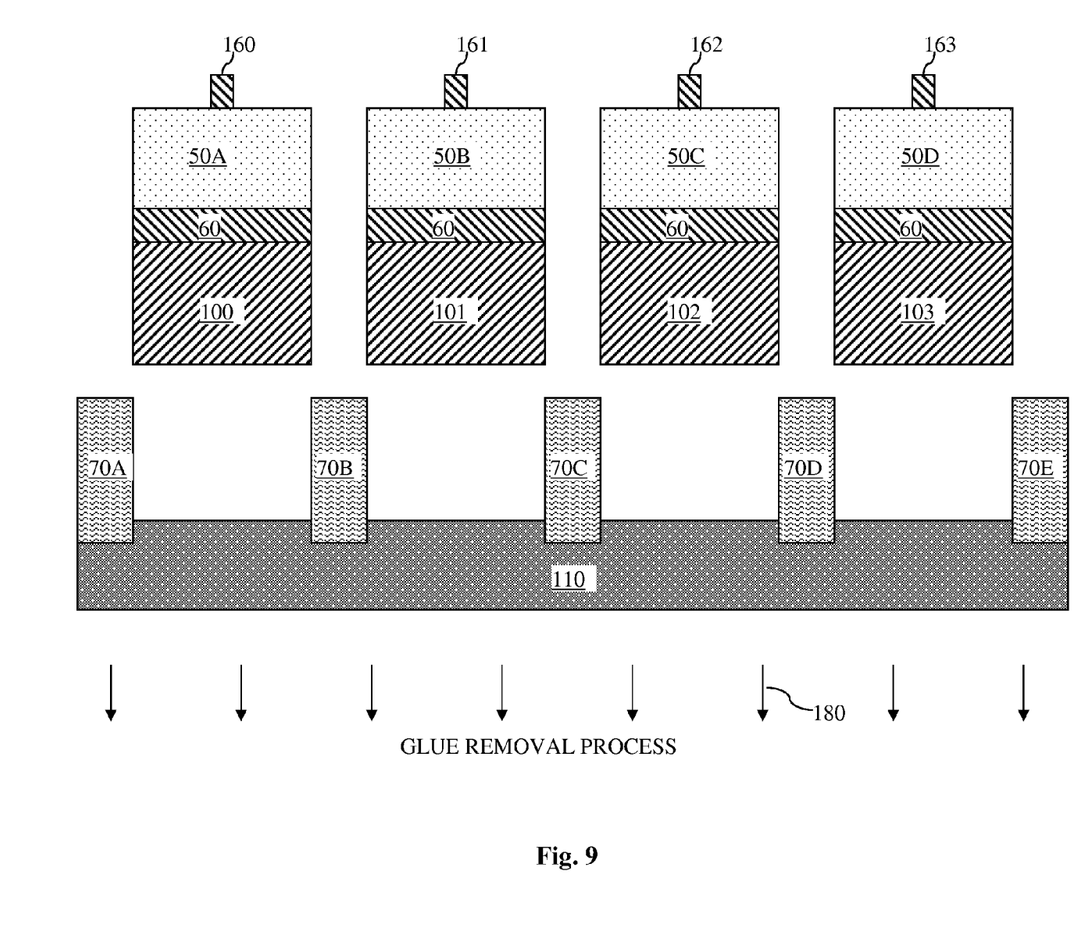

Referring now to FIG. 9, a glue removal process 180 is used to remove the glue material 110. In an embodiment, the glue removal process 180 includes a peeling off process, in which the glue material 110 is peeled off along with the photoresist components 70A-70E. One of the reasons that the photoresist components can be peeled off along with the glue material 110 is that, the adhesion force between the photoresist components 70A-70E and the glue material 110 is stronger than the adhesion force between the photoresist components 70A-70E and the conductive components 100-103 adjacent to the photoresist components 70A-70E.

Meanwhile, the adhesion force between the conductive components 100-103 and the glue material 110 is not as strong as the adhesion force between the conductive components 100-103 and the layer 60. Therefore, the conductive components 100-103 will not be peeled off along with the glue material 110. Also, although not illustrated for the sake of simplicity, the entire wafer may be transferred to a blue tape (used to carry out further processing) before the glue material 110 is removed.

At this stage of fabrication, it can be seen that the LED dies 50A-50D have been completely separated from one another, where no mechanical dicing processes are used to accomplish such separation. It is understood that addition processes may be performed to complete the fabrication of each individual LED die. For example, an encapsulant structure may be formed over each LED die to mold the LED die. The encapsulant structure may include an organic material such as resin or plastic and may provide sufficient sealing for the LED die to minimize corrosion concerns. Lenses may also be formed for each LED die, so that the light emitted by the LED die may be directed and focused in an intended propagation direction. For the sake of simplicity, these additional fabrication processes are not discussed in detail herein.

The embodiments of the present disclosure discussed above have advantages over existing methods. It is understood, however, that other embodiments may offer different advantages, and that no particular advantage is required for any embodiment. One of the advantages is that no mechanical dicing processes are used to physically separate the LED dies. Traditional LED fabrication processes may involve the use of mechanical saw devices to cut through the scribe line regions, which are also referred to as street line regions of the LED wafer. This sawing process may damage the edges of the LED dies. Moreover, if the LED dies are formed on a metal substrate, the sawing may create metal contaminant particles, which may substantially degrade the performance and yield of the LED devices.

Here, photoresist components (such as 70A-70E) are formed in (or over) the scribe line or street line regions of the LED wafer. The thermally conductive metal components (such as 100-103) are formed between the scribe line regions—in other words, the conductive metal components are formed directly underneath the LED dies. As such, no cutting of metal is needed—since these conductive metal components are not formed in the scribe line regions by design. The elimination of metal cutting will increase yield and improve performance of the LED devices as well as reduce LED fabrication costs.

Also, the sapphire substrate removal process (such as process 150) requires no physical or mechanical cutting, since it is carried out using a radiation process 140 (shown in FIG. 6). The semiconductor regions (such as 50E-50I) in the scribe line regions can be removed along with the sapphire substrate 35, which simplifies LED fabrication processes. Also, in the embodiment where dry etching is used to form openings in the scribe line regions, the resulting LED dies have smooth sidewalls, which may also help increase yield and improve performance of the LED devices.

Another advantage is that each conductive metal component serves as a good heat sync for the respective LED device. This may be beneficial, especially when the LED devices generate large amounts of heat during its operation.

An additional advantage is that the photoresist components (such as 70A-70E) can be removed during the removal of the glue material 110. Once again, this simplifies the fabrication of the LED devices and therefore reduces fabrication costs.

One of the broader forms of the present disclosure involves a method. The method includes: providing a substrate having opposite first and second sides, wherein the first side has a semiconductor layer formed thereon; forming a photoresist layer over the semiconductor layer; patterning the photoresist layer into a plurality of photoresist components, the photoresist components being separated by openings; filling the openings with a plurality of thermally conductive components; and separating the semiconductor layer into a plurality of dies using a radiation process that is performed to the substrate from the second side, each of the first regions of the substrate being aligned with one of the conductive components.

Another of the broader forms of the present disclosure involves a method of LED fabrication. The method includes: providing a wafer having a sapphire substrate and a semiconductor layer formed on the sapphire substrate, the semiconductor layer containing a plurality of un-separated LED dies; forming a photo-sensitive layer over the semiconductor layer; performing a photolithography process to pattern the photo-sensitive layer into a plurality of patterned portions, the patterned portions being separated by a plurality of openings that are each substantially aligned with one of the LED dies; forming a metal material in each of the openings; radiating the wafer in a localized manner such that only portions of the wafer that are substantially aligned with the openings are radiated; and removing the sapphire substrate along with un-radiated portions of the semiconductor layer, thereby separating the plurality of LED dies into individual LED dies.

Still another of the broader forms of the present disclosure involves a method of fabricating an LED device. The method includes: providing a sapphire substrate having a semiconductor layer formed thereon; forming a patterned photoresist layer over the semiconductor layer, the photoresist layer having an opening therein; forming a conductive component in the opening; and radiating a first portion of the sapphire substrate with a laser, the first portion of the sapphire substrate being aligned with the conductive component; wherein: a second portion of the sapphire substrate that is aligned with the patterned photoresist layer is not radiated; in response to the radiating, the first portion of the sapphire substrate becomes separated from a first portion of the semiconductor layer therebelow, the first portion of the semiconductor layer being aligned with the conductive component; and the second portion of the sapphire substrate remain coupled to a second portion of the semiconductor layer therebelow after the radiating, the second portion of the semiconductor layer being aligned with the patterned photoresist layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    providing a substrate having opposite first and second sides, wherein the first side has a semiconductor layer formed thereon;
    forming a photoresist layer over the semiconductor layer such that an entire portion of a bottom surface of the photoresist layer is formed on a top surface of the semiconductor layer;
    patterning the photoresist layer into a plurality of photoresist components, the photoresist components being separated by openings;
    filling the openings with a plurality of conductive components; and
    separating the semiconductor layer into a plurality of dies using a radiation process that includes selectively radiating a plurality of first regions of the substrate from the second side, each of the first regions of the substrate being aligned with a respective one of the conductive components.

2. The method of claim 1, wherein the photoresist layer is formed in a street line region of the semiconductor layer.

3. The method of claim 1,
    wherein the radiation process is carried out in a manner so that a plurality of second regions of the substrate are unradiated, each of the second regions being aligned with one of the photoresist components; and
    wherein as a result of the radiating, the first regions of the substrate become de-coupled from the semiconductor layer, and the second regions of the substrate remain coupled to the semiconductor layer.

4. The method of claim 3, wherein the radiating causes a nitrogen gas to be released at interfaces between the first regions of the substrate and the semiconductor layer; and further including: removing the substrate along with portions of the semiconductor layer that are aligned with and coupled to the second regions of the substrate.

5. The method of claim 3, further including, before the radiating:
    forming a glue material over the conductive components and the photoresist components;
    forming a light-to-heat conversion layer on a glass substrate; and
    bonding the glass substrate to the glue material in a manner so that the light-to-heat conversion layer is disposed in between the glass substrate and the glue material.

6. The method of claim 5, further including, after the radiating:
    performing a laser scan through the glass substrate to cause heating in the light-to-heat conversion layer, thereby separating the glass substrate from the light-to-heat conversion layer;
    de-bonding the glass substrate; and
    thereafter removing the glue material, the removing the glue material also removing the photoresist components.

7. The method of claim 1, wherein:
    the substrate includes a sapphire material;
    the conductive component is thermally conductive; and
    the semiconductor layer includes a p-type gallium nitride layer, an n-type gallium nitride layer, and a multiple quantum well that is disposed in between the p-type gallium nitride layer and the n-type gallium nitride layer.

8. The method of claim 1, further including, before the forming the photoresist layer, forming one of: an ohmic layer, a reflective layer, and a capped layer over the semiconductor layer; and wherein the forming the photoresist layer is carried out in a manner so that the semiconductor layer and the photoresist layer are disposed on opposite sides of the ohmic layer.

9. A method, comprising:
forming a patternable layer over a semiconductor layer, the semiconductor layer being disposed over a substrate;
patterning the patternable layer to form a plurality of patternable features, the patternable features being spaced apart from one another;
forming a plurality of conductive features between the patternable features;
forming a glue material over the conductive features;
forming a light-to-heat conversion layer on a glass substrate; and
bonding the glue material to the light-to-heat conversion layer and the glass substrate; and
dividing the semiconductor layer into a plurality of different portions, wherein the dividing is performed at least in part by selectively radiating a plurality of regions of the substrate that are each aligned with a respective one of the conductive features.

10. The method of claim 9, wherein the semiconductor layer is formed on a first side of the substrate, and wherein the radiating is performed from a second side of the substrate opposite the first side.

11. The method of claim 9, wherein the patternable layer includes a photoresist material and is formed over a scribe line region of the substrate.

12. The method of claim 9, wherein the dividing is performed such that regions of the substrate aligned with the patternable features are not radiated.

13. The method of claim 9, wherein the plurality of regions of the substrate decouples from the semiconductor layer after being radiated.

14. The method of claim 9, wherein the semiconductor layer includes:
a p-type gallium nitride layer;
an n-type gallium nitride layer; and
a multiple quantum well located between the p-type gallium nitride layer and the n-type gallium nitride layer.

15. A method, comprising:
forming a patterned mask over a semiconductor layer that is disposed on a substrate, wherein the patterned mask is formed to have a bottom surface, and wherein an entire portion of the bottom surface of the patterned mask is formed over a topmost surface of the semiconductor layer, the patterned mask containing a plurality of openings;
forming a plurality of conductive devices in the openings; and
transforming the semiconductor layer into a plurality of dies at least in part by applying radiation to a plurality of first regions of the substrate that are each aligned with a respective one of the conductive devices while leaving a plurality of second regions of the substrate unradiated, wherein the radiation is applied so that a nitrogen gas is released at interfaces between the first regions of the substrate and the semiconductor layer.

16. The method of claim 15, wherein the patterned mask includes a patterned photoresist layer, and wherein the patterned mask is formed over a street line region of the semiconductor layer.

17. The method of claim 15, further comprising: removing the substrate along with unradiated portions of the semiconductor layer.

18. The method of claim 15, further comprising:
forming a glue material over the conductive devices and the patternable mask;
attaching the glue material to a glass substrate having a light-to-heat conversion layer disposed thereon, wherein the light-to-heat conversion layer is disposed in between the glass substrate and the glue material;
performing a laser scan through the glass substrate to generate heat in the light-to-heat conversion layer, thereby separating the glass substrate from the light-to-heat conversion layer;
detaching the glass substrate; and
removing the glue material along with the patternable mask.

19. The method of claim 15, wherein:
the substrate includes a sapphire material;
the conductive devices include metal; and
the semiconductor layer includes a p-type gallium nitride layer, an n-type gallium nitride layer, and a multiple quantum well that is disposed in between the p-type gallium nitride layer and the n-type gallium nitride layer.

20. The method of claim 15, wherein the radiation includes a 248 nanometer KrF laser.

* * * * *